(12) United States Patent
Joo et al.

(10) Patent No.: US 7,148,106 B2
(45) Date of Patent: Dec. 12, 2006

(54) METHODS OF FABRICATING NON-VOLATILE MEMORY DEVICES INCLUDING NANOCRYSTALS

(75) Inventors: Kyong-Hee Joo, Gyeonggi-do (KR); Jin-Ho Park, Seoul (KR); In-Seok Yeo, Seoul (KR); Seung-Hyun Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/023,993

(22) Filed: Dec. 28, 2004

(65) Prior Publication Data

US 2006/0046384 A1    Mar. 2, 2006

(30) Foreign Application Priority Data

Aug. 24, 2004   (KR)   ................ 10-2004-0066930

(51) Int. Cl.
  *H01L 21/336*  (2006.01)
(52) U.S. Cl. .................. 438/257; 257/315
(58) Field of Classification Search ........ 438/257–266; 257/314–320
   See application file for complete search history.

(56) References Cited

U.S. PATENT DOCUMENTS

| | | | |
|---|---|---|---|
| 6,297,095 B1 * | 10/2001 | Muralidhar et al. | 438/257 |
| 6,320,784 B1 * | 11/2001 | Muralidhar et al. | 365/151 |
| 6,344,403 B1 * | 2/2002 | Madhukar et al. | 438/503 |
| 6,713,812 B1 * | 3/2004 | Hoefler et al. | 257/316 |
| 6,784,103 B1 * | 8/2004 | Rao et al. | 438/680 |
| 6,808,986 B1 * | 10/2004 | Rao et al. | 438/257 |
| 6,833,161 B1 * | 12/2004 | Wang et al. | 427/250 |
| 6,888,739 B1 * | 5/2005 | Forbes | 365/149 |
| 6,902,763 B1 * | 6/2005 | Elers et al. | 427/250 |
| 6,933,225 B1 * | 8/2005 | Werkhoven et al. | 438/627 |
| 2002/0028541 A1 * | 3/2002 | Lee et al. | 438/149 |
| 2003/0235064 A1 * | 12/2003 | Batra et al. | 365/100 |
| 2005/0067651 A1 * | 3/2005 | Kim et al. | 257/314 |

FOREIGN PATENT DOCUMENTS

| | | |
|---|---|---|
| JP | 2000-340682 A | 12/2000 |
| KR | 10-0434553 B1 | 5/2004 |

OTHER PUBLICATIONS

IC Knowledge. Technology Backgrounder: Atomic Layer Deposition Excerpt. Jun. 16, 2004.*
Liu et al., *Metal Nanocrystal Memories-Part I: Device Design and Fabrication*, IEEE Transactions on Electron Devices, vol. 49, No. 9, Sep. 2002, pp. 1606-1622.

* cited by examiner

*Primary Examiner*—Matthew Smith
*Assistant Examiner*—Phillip Green
(74) *Attorney, Agent, or Firm*—Myers Bigel Sibley & Sajovec, P.A.

(57) ABSTRACT

Non-volatile memory devices can be fabricated by forming a tunnel dielectric layer on a semiconductor substrate, subjecting the semiconductor substrate having the tunnel dielectric layer to an atomic layer deposition (ALD) process to form nanocrystals on the tunnel dielectric layer, removing the semiconductor substrate having the nanocrystals from an atomic layer deposition chamber, forming a control gate dielectric layer on the semiconductor substrate having the nanocrystal, and forming a control gate electrode on the semiconductor substrate having the control gate dielectric layer.

32 Claims, 3 Drawing Sheets

METHODS OF FABRICATING NON-VOLATILE MEMORY DEVICES INCLUDING NANOCRYSTALS

RELATED APPLICATION

This application claims the benefit of Korean Patent Application No. 2004-0066930, filed Aug. 24, 2004, the disclosure of which is hereby incorporated herein by reference in its entirety as if set forth fully herein.

FIELD OF THE INVENTION

The present invention relates to methods of fabricating memory devices, and more particularly, to methods of fabricating non-volatile semiconductor memory devices.

BACKGROUND OF THE INVENTION

Semiconductor memory devices can be classified as a volatile memory device or a non-volatile memory device according to the data storage method. A volatile memory device can lose stored data when power is no longer supplied to the device. In contrast, a non-volatile memory device has a feature capable of retaining data during a state where power is not supplied. A non-volatile memory device having such a feature, for example, a flash memory device, can be used in mobile communication terminals, memory cards, and the like.

A method using a floating gate as a storage layer constituting a unit cell can be employed as a technique for implementing the non-volatile memory device. However, the memory device with the floating gate can present disadvantages in that charges are stored in polycrystalline silicon such that the memory device can be affected by a small defect of a tunnel dielectric layer, thereby potentially degrading data retention characteristics. More specifically, the floating gate non-volatile memory device can have a structure in which a tunnel dielectric layer, a floating gate, a control gate dielectric layer, and a control gate are sequentially stacked on a channel region of a semiconductor substrate. The floating gate non-volatile memory device having such a structure may be programmed using a hot electron injection method or the Fowler-Nordheim (F-N) tunneling method. When electrons are injected into the floating gate through the programming process, a threshold voltage can be increased. When a voltage smaller than the increased threshold voltage is applied to the control gate, current may not flow in a programmed cell. This process allows the stored data to be read. However, in the floating gate non-volatile memory cell, a problem associated with electron retention may occur. That is, in order for the non-volatile memory cell to retain the programmed data, it is desirable that the floating gate retain the injected electrons. Additionally, when there are defects, such as pinholes in the tunnel dielectric layer, the electrons injected into the floating gate may exit via the defects. Further, since the floating gate is formed of a conductive layer such as polycrystalline silicon, high leakage current may be generated even by defects present in a part of the tunnel dielectric layer.

Recently, semiconductor memory devices including nanocrystals have been studied as a means for potentially solving problems associated with a memory device having a floating gate.

Semiconductor memory devices including nanocrystals are described in U.S. Pat. No. 6,090,666 to Ueda et al. entitled "Method for Fabricating Semiconductor Nanocrystal and Semiconductor Memory Device using the Semiconductor Nanocrystal."

Ueda et al. provides that in semiconductor memory devices including nanocrystals, semiconductor nanocrystals are formed on a semiconductor substrate and are used as storage patterns. More specifically, the semiconductor nanocrystals are formed of a semiconductor material such as silicon (Si) or germanium (Ge) and are spaced apart from each other by a dielectric layer. During programming, electrons are injected into the nanocrystals, and since the nanocrystals are spaced apart from each other, the movement of the electrons can be limited between the nanocrystals. Accordingly, even though a defect occurs in a part of a tunnel dielectric layer, leakage current resulting from the defect may affect only nanocrystals near the defect. Therefore, the nanocrystalline structure is capable of improving the charge retention capability of the memory device. Further, the higher the density of the nanocrystals, the more likely the improvement of the charge retention capability. Consequently, nanocrystals of small size as well as a plurality of nanocrystals per unit area are desirable.

Currently, however, semiconductor nanocrystals may be formed by depositing a silicon layer or a germanium layer on a semiconductor substrate using a chemical vapor deposition (CVD) method followed by annealing the silicon layer or germanium layer at a high temperature. The size of the semiconductor nanocrystals formed varies with the thickness of the silicon layer or germanium layer. Consequently, in order to form semiconductor nanocrystals having a small size, it is desirable to implement a technique of forming the silicon layer or germanium layer having a decreased thickness. However, a technique using the chemical vapor deposition (CVD) method has at least the limitations related to the deposition of the silicon layer or the germanium layer to achieve a decreased thickness as well as the adjustment of the deposition degree. Semiconductor nanocrystals generally have a size of about 8 nm. Therefore, it is desirable to utilize a technique capable of forming the nanocrystals in a smaller size.

In attempts to discover other methods for substituting the semiconductor nanocrystals, methods using metal nanocrystals have been studied. A semiconductor memory device using the metal nanocrystals is described in "Metal nanocrystals memories," Liu et al., IEEE transactions on electron devices, VOL. 49, NO. 9, September 2002.

Liu et al. suggests that metal layers, such as a tungsten layer, a gold (Au) layer, or a silver (Ag) layer, are deposited on a semiconductor substrate by a chemical vapor deposition (CVD) method and then are annealed at a high temperature to form the metal nanocrystals. However, in the technique of using the chemical vapor deposition (CVD) method, it can be problematic to control deposition time and temperature, and thus, the size and density of the formed metal nanocrystals may not be desirable.

Accordingly, there is a need for a technique for forming nanocrystals having a small and uniform size and proper density on a semiconductor substrate.

SUMMARY OF THE INVENTION

Embodiments of the present invention provide methods of manufacturing non-volatile memory devices comprising forming a tunnel dielectric layer on a semiconductor substrate, subjecting the semiconductor substrate having the tunnel dielectric layer to an atomic layer deposition (ALD) process to form nanocrystals on the tunnel dielectric layer, removing the semiconductor substrate having the nanocrystals from an atomic layer deposition chamber, forming a control gate dielectric layer on the semiconductor substrate having the nanocrystals and forming a control gate electrode on the semiconductor substrate having the control gate dielectric layer.

Further embodiments of the present invention provide methods of manufacturing non-volatile memory devices comprising forming a tunnel dielectric layer on a semiconductor substrate, subjecting the semiconductor substrate having the tunnel dielectric layer to an atomic layer deposition (ALD) process, injecting a reduction gas into an atomic layer deposition chamber to form reduction gas chemical adsorption points on the tunnel dielectric layer, injecting a first reactant into an atomic layer deposition chamber to form first reactant chemical adsorption points on the tunnel dielectric layer thereby forming nanocrystals on the semiconductor substrate, removing the semiconductor substrate having the nanocrystals from the atomic layer deposition chamber, forming a control gate dielectric layer on the semiconductor substrate having the nanocrystal and forming a control gate electrode on the semiconductor substrate having the control gate dielectric layer.

Embodiments of the present invention can further provide methods of manufacturing non-volatile memory devices comprising forming a tunnel dielectric layer on a semiconductor substrate, subjecting the semiconductor substrate having the tunnel dielectric layer to an atomic layer deposition (ALD) process, injecting $B_2H_6$ into a atomic layer deposition chamber to form $B_2H_6$ chemical adsorption points on the tunnel dielectric layer, injecting $WF_6$ into the atomic layer deposition chamber to react $WF_6$ with the $B_2H_6$ chemical adsorption points to provide tungsten (W) chemical adsorption points on the tunnel dielectric layer, injecting an ammonia gas into the atomic layer deposition chamber so that the ammonia gas reacts with the tungsten (W) chemical adsorption points to provide tungsten nitride (WN) nanocrystals, removing the semiconductor substrate having the tungsten nitride (WN) nanocrystals from the atomic layer deposition chamber, forming a control gate dielectric layer on the semiconductor substrate having the tungsten nitride (WN) nanocrystals and forming a control gate electrode on the semiconductor substrate having the control gate dielectric layer.

BRIEF DESCRIPTION OF THE DRAWINGS

The above aspects of the present invention will become more apparent by describing in detail embodiments of the present invention with reference to the attached drawings in which.

DETAILED DESCRIPTION OF EMBODIMENTS OF THE INVENTION

Figure 1:
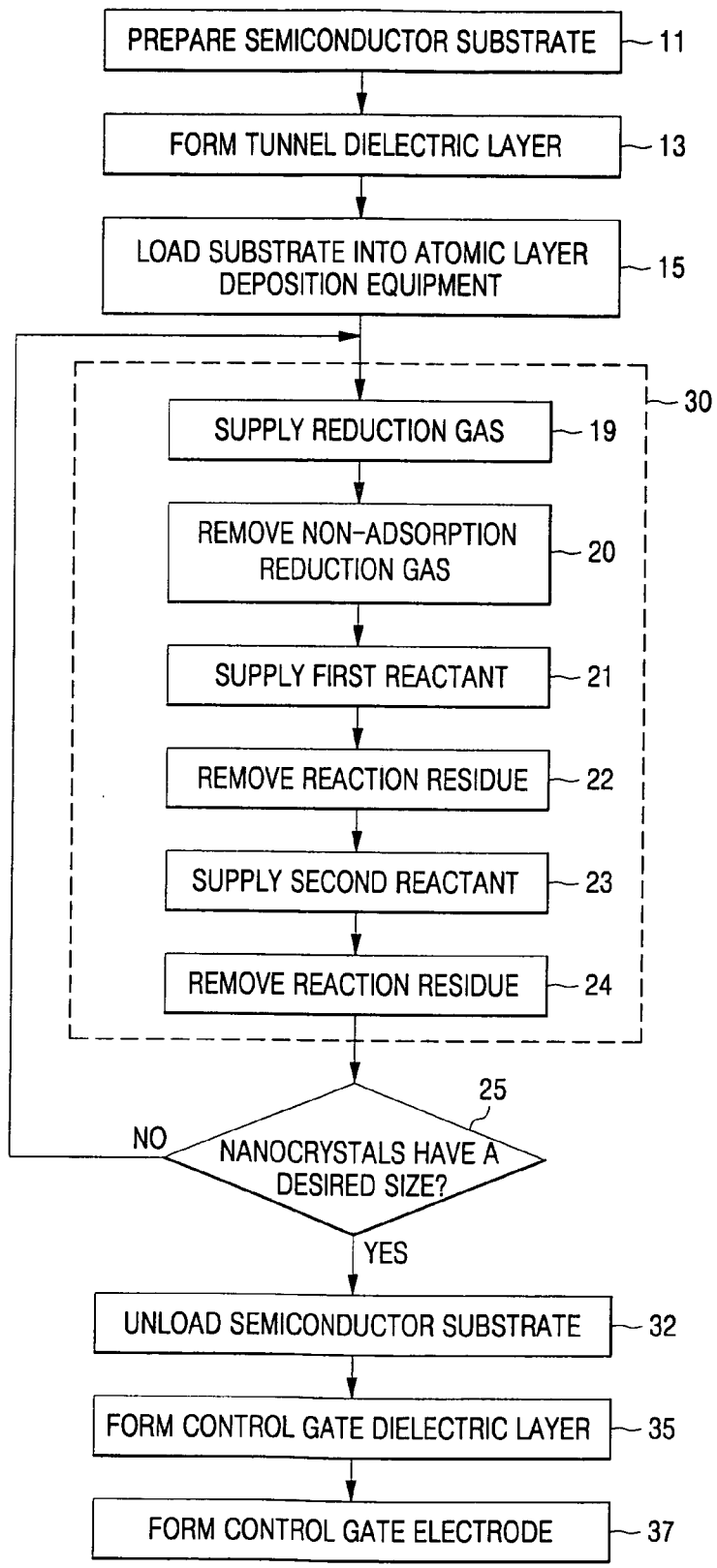
FIG. 1 presents a process flow diagram illustrating methods of fabricating a non-volatile memory device with nanocrystals according to embodiments of the present invention.

The present invention will now be described more fully herein with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art.

The terminology used in the description of the invention herein is for the purpose of describing particular embodiments only and is not intended to be limiting of the invention. As used in the description of the embodiments of the invention and the appended claims, the singular forms "a", "an" and "the" are intended to include the plural forms as well, unless the context clearly indicates otherwise. As used herein, the term "and/or" includes any and all combinations of one or more of the associated listed items and may be abbreviated as "/".

Unless otherwise defined, all terms, including technical and scientific terms used in the description of the invention, have the same meaning as commonly understood by one of ordinary skill in the art to which this invention belongs. All publications, patent applications, patents, and other references mentioned herein are incorporated by reference in their entirety.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature or at different temperatures without departing from the teachings of the present invention.

In the drawings, the thickness of layers and regions are exaggerated for clarity. It will also be understood that when a layer is referred to as being "on" another layer or substrate or a reactant is referred to as being introduced, exposed or feed "onto" another layer or substrate, it can be directly on the other layer or substrate, or intervening layers can also be present. However, when a layer, region or reactant is described as being "directly on" or introduced, exposed or feed "directly onto" another layer or region, no intervening layers or regions are present. Additionally, like numbers refer to like compositions or elements throughout.

As will be appreciated by those skilled in the art, the present invention may be embodied as methods of manufacturing devices, using such devices and devices formed according to the methods described herein.

Embodiments of the invention provide methods of forming nanocrystals that can have a uniform size and a desired density on a semiconductor substrate and using the nanocrystals as storage layers of a non-volatile memory device.

Embodiments of the present invention further provide methods of fabricating a non-volatile memory device with nanocrystals which can include preparing a semiconductor substrate and forming a tunnel dielectric layer on the semiconductor substrate. Subsequently, the semiconductor substrate having the tunnel dielectric layer is subjected to an atomic layer deposition (ALD) process, and nanocrystals are formed on the tunnel dielectric layer by performing an atomic layer deposition process cycle. The size of the nanocrystals is confirmed and the atomic layer deposition process cycle can be repeated a plurality of times to form a desired size of nanocrystals. The semiconductor substrate having the nanocrystals can be removed from the atomic layer deposition equipment. A control gate dielectric layer can be formed on the semiconductor substrate having the nanocrystals, and a control gate electrode can be formed on the semiconductor substrate having the control gate dielectric layer.

The tunnel dielectric layer may be formed of one layer, wherein the layer can be a silicon oxide layer, a silicon nitride layer, a silicon oxynitride layer, a hafnium oxide layer (HfO), a hafnium silicon oxide layer (HfSiO), a zirconium oxide layer (ZrO), a zirconium silicon oxide layer (ZrSiO) and/or a gadolinium oxide layer (GdO). Further, the tunnel dielectric layer may be formed of a stacked layer or a mixed material layer of at least two layers such as a silicon oxide layer, a silicon nitride layer, a silicon oxynitride layer, a hafnium oxide layer (HfO), a hafnium silicon oxide layer (HfSiO), a zirconium oxide layer (ZrO), a zirconium silicon oxide layer (ZrSiO) and/or a gadolinium oxide layer (GdO).

Additionally, the atomic layer deposition process cycle may include forming reduction gas chemical adsorption points on the tunnel dielectric layer by injecting a reduction gas into the atomic layer deposition equipment. The reduction gas may comprise at least one of the following: $B_2H_6$, $SiH_4$, $Si_2H_6$ or $SiH_2Cl_6$. At least two reduction gases such as $B_2H_6$, $SiH_4$, $Si_2H_6$ and $SiH_2Cl_6$ may be sequentially supplied as the reduction gas. A remaining non-adsorption reduction gas in the atomic layer deposition equipment can be removed. A first reactant may be injected into the atomic layer deposition equipment to form first reactant chemical adsorption points on the tunnel dielectric layer. The first reactant may comprise $WF_6$, $TiCl_4$, $TiI_4$, $Ti(OEt)_4$, $TaCl_5$, $CuCl$, $MoCl_5$ and/or $Ni(acac)_2$. The first reactant may be a compound comprising zirconium (Zr), hafnium (Hf), yttrium (Y) and/or aluminum (Al). Alternatively, the first reactant can be $SiCl_4$ and/or $BCl_3$. When the first reactant chemical adsorption points are formed on the tunnel dielectric layer, the excess first reactant may no longer react through a self-limiting reaction process. When the reduction gas chemical adsorption points are formed on the tunnel dielectric layer, the first reactant may be transposed with the reduction gas chemical adsorption points to form the first reactant chemical adsorption points. Subsequently, a reaction residue in the atomic layer deposition equipment can be removed. The removal of the reaction residue may be performed in a method of exhausting the atomic layer deposition equipment, a method of injecting an inert gas into the atomic layer deposition equipment, a method of carrying out both the exhaustion and the injection, and/or a method of sequentially carrying out the exhaustion and the injection at least one time. The inert gas may be argon (Ar) and/or nitrogen ($N_2$). The methods may further include promoting a second reactant to react with the first reactant chemical adsorption points by injecting the second reactant into the atomic layer deposition equipment after removing the reaction residue. The second reactant may be an ammonia gas such as $NH_3$, and the second reactant may be $H_2O$, $H_2O_2$, $O_2$ and/or $O_3$.

According to embodiments of the present invention, the nanocrystal may be tungsten (W), titanium (Ti), tantalum (Ta), copper (Cu), molybdenum (Mo) and/or nickel (Ni), or a nitride thereof. Alternatively, the nanocrystal may be an oxide nanocrystal comprising zirconium (Zr), hafnium (Hf) yttrium (Y) and/or aluminum (Al). In addition, the nanocrystal may be a silicon nanocrystal, a silicon nitride nanocrystal, a boron nanocrystal and/or a boron nitride nanocrystal.

According to other embodiments, the present invention provides methods of fabricating a non-volatile memory device with nanocrystals. The method includes preparing a semiconductor substrate and forming a tunnel dielectric layer on the semiconductor substrate. Subsequently, the semiconductor substrate having the tunnel dielectric layer is subjected to the atomic layer deposition process and a reduction gas is injected into the atomic layer deposition equipment to form reduction gas chemical adsorption points on the tunnel dielectric layer. A first reactant can be injected into the atomic layer deposition equipment so that the first reactant reacts with the reduction gas chemical adsorption points, to thereby form first reactant chemical adsorption points on the tunnel dielectric layer. Forming the reduction gas chemical adsorption points and forming the first reactant chemical adsorption points can be repeated a plurality of times to form a desired size of nanocrystals. The semiconductor substrate having the nanocrystals can be removed from the atomic layer deposition equipment. A control gate dielectric layer can be formed on the semiconductor substrate having the nanocrystals, and a control gate electrode is formed on the semiconductor substrate having the control gate dielectric layer.

The reduction gas can be $B_2H_6$, $SiH_4$, $Si_2H_6$ and/or $SiH_2Cl_6$. At least two reduction gases, such as $B_2H_6$, $SiH_4$, $Si_2H_6$ and/or $SiH_2Cl_6$ may be sequentially supplied as the reduction gas.

The first reactant can be $WF_6$, $TiCl_4$, $TiI_4$, $Ti(OEt)_4$, $TaCl_5$, $CuCl$, $MoCl_5$ and/or $Ni(acac)_2$.

The nanocrystal can be tungsten (W), titanium (Ti), tantalum (Ta), copper (Cu), molybdenum (Mo), and/or nickel (Ni).

The method may further include promoting a second reactant to react with the first reactant chemical adsorption points by injecting the second reactant into the atomic layer deposition equipment after forming the first reactant chemical adsorption points. The second reactant may be an ammonia gas, such as $NH_3$. As a result, the nanocrystal may be formed of a nitride such as tungsten (W), titanium (Ti), tantalum (Ta), copper (Cu), molybdenum (Mo) and/or nickel (Ni).

In yet another embodiment, the present invention is directed to methods of manufacturing a non-volatile memory device with nanocrystals, wherein fabrication includes preparing a semiconductor substrate, and forming a tunnel dielectric layer on the semiconductor substrate. Subsequently, the semiconductor substrate having the tunnel dielectric layer is subjected to the atomic layer deposition process, and $B_2H_6$ can be injected into the atomic layer deposition equipment to form $B_2H_6$ chemical adsorption points on the tunnel dielectric layer. $WF_6$ can be injected into the atomic layer deposition equipment so that the $WF_6$ reacts with the $B_2H_6$ chemical adsorption points, to thereby form tungsten (W) chemical adsorption points on the tunnel dielectric layer. An ammonia gas, such as $NH_3$ can be injected into the atomic layer deposition equipment so that the ammonia gas reacts with the tungsten (W) chemical adsorption points, to thereby form tungsten nitride (WN) nanocrystals. The size of the tungsten nitride (WN) nanocrystals can be confirmed and then the step of forming the $B_2H_6$ chemical adsorption points and forming the tungsten nitride (WN) nanocrystals can be repeated a plurality of times to form a desired size of tungsten nitride (WN) nanocrystals. The semiconductor substrate having the tungsten nitride (WN) nanocrystals can be removed from the atomic layer deposition equipment. A control gate dielectric layer can be formed on the semiconductor substrate having the tungsten nitride (WN) nanocrystals, and a control gate electrode can be formed on the semiconductor substrate having the control gate dielectric layer.

Embodiments of the present invention will be further described in detail with reference to the accompanying drawings.

Referring to FIG. 1, this figure presents a process flow diagram illustrating methods of fabricating a non-volatile memory device with nanocrystals according to embodiments of the present invention, and FIGS. 2 to 7 are cross-sectional views illustrating the fabrication methods.

Figure 2:
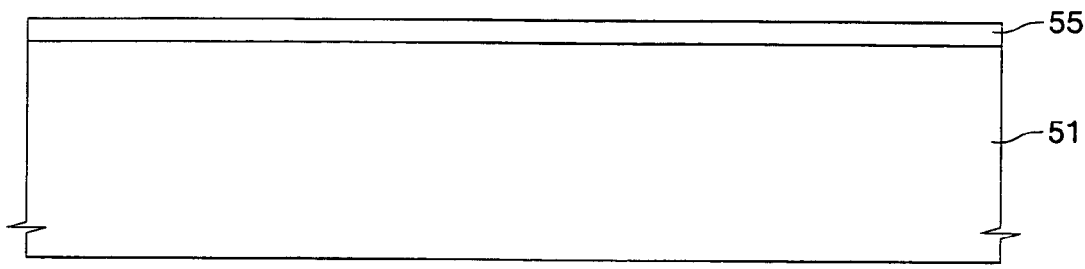
FIG. 2 presents a cross-sectional view illustrating methods of fabricating a non-volatile memory device according to embodiments of the present invention wherein a tunnel dielectric layer can be formed on an entire surface of the semiconductor substrate, which may be a silicon wafer.

Referring to FIGS. 1 and 2, a semiconductor substrate 51 is prepared (Step 11 of FIG. 1). The semiconductor substrate 51 may be a silicon wafer. Typically, an isolation layer that defines an active region is formed on the semiconductor substrate 51, but it will not be separately shown for simplicity of illustration.

A tunnel dielectric layer 55 is formed on a surface of the semiconductor substrate 51 (Step 13 of FIG. 1). The tunnel dielectric layer 55 may be formed such that at least one layer can be a silicon oxide layer, a silicon nitride layer, a silicon oxynitride layer, a hafnium oxide layer (HfO), a hafnium silicon oxide layer (HfSiO), a zirconium oxide layer (ZrO), a zirconium silicon oxide layer (ZrSiO) and/or a gadolinium oxide layer (GdO). Alternatively, the tunnel dielectric layer 55 may be formed of a stacked layer or a mixed material layer such that at least two layers can be a silicon oxide layer, a silicon nitride layer, a silicon oxynitride layer, a hafnium oxide layer (HfO), a hafnium silicon oxide layer (HfSiO), a zirconium oxide layer (ZrO), a zirconium silicon oxide layer (ZrSiO), a gadolinium oxide layer (GdO) or a combination thereof. In an embodiment of the present invention, the tunnel dielectric layer 55 is a silicon oxide layer having a thickness of about 25 Å.

Figure 3:
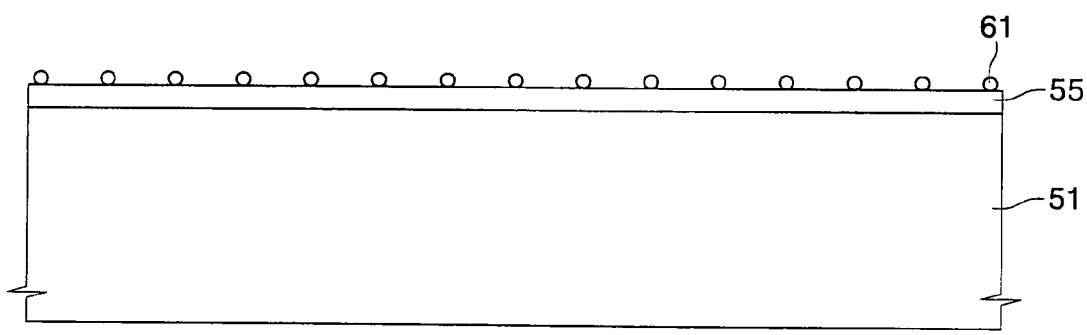
FIG. 3 presents a cross-sectional view illustrating methods of fabricating a non-volatile memory device according to embodiments of the present invention wherein the semiconductor substrate having the tunnel dielectric layer is subjected to an atomic layer deposition (ALD) process wherein the ALD cycle includes injecting a reduction gas into the ALD equipment resulting in the formation of reduction gas chemical adsorption points.

Referring to FIGS. 1 and 3, the semiconductor substrate 51 having the tunnel dielectric layer 55 is placed into a specified position in the atomic layer deposition equipment (Step 15 of FIG. 1). Subsequently, the semiconductor substrate 51 is preheated to a process temperature suitable for atomic layer deposition. For example, when tungsten nitride (WN) nanocrystals are desired to be formed on the semiconductor substrate 51, the preheating temperature may be about 200° C. to about 400° C. The preheating of the semiconductor substrate 51 may be made concurrently with exhaustion of the atomic layer deposition equipment.

When the semiconductor substrate 51 is heated to a desired process temperature, nanocrystals can be formed on the tunnel dielectric layer 55 using an atomic layer deposition (ALD) method. The atomic layer deposition (ALD) method may include an atomic layer deposition process cycle 30.

The atomic layer deposition process cycle 30 may include injecting a reduction gas into the atomic layer deposition equipment (Step 19 of FIG. 1). The reduction gas can be $B_2H_6$, $SiH_4$, $Si_2H_6$ and/or $SiH_2Cl_6$. Alternatively, the reduction gas may be at least two gases selected from $B_2H_6$, $SiH_4$, $Si_2H_6$ or $SiH_2Cl_6$. In addition, the at least two gases selected from $B_2H_6$, $SiH_4$, $Si_2H_6$ and $SiH_2Cl_6$ may be sequentially supplied as the reduction gas. In an embodiment of the present invention, the reduction gas is $B_2H_6$. The reduction gas supplied into the atomic layer deposition equipment is adsorbed on the tunnel dielectric layer 55 to form reduction gas chemical adsorption points 61. Subsequently, a remaining non-adsorption reduction gas in the atomic layer deposition equipment can be removed (Step 20 of FIG. 1). The removal of the non-adsorption reduction gas may be performed in a method of exhausting the atomic layer deposition equipment, a method of injecting an inert gas into the atomic layer deposition equipment, a method of carrying out both the exhaustion and the injection, and/or a method of sequentially carrying out the exhaustion and the injection at least one time. The inert gas may be argon (Ar) and/or nitrogen ($N_2$). However, supplying the reduction gas may be omitted.

Figure 4:
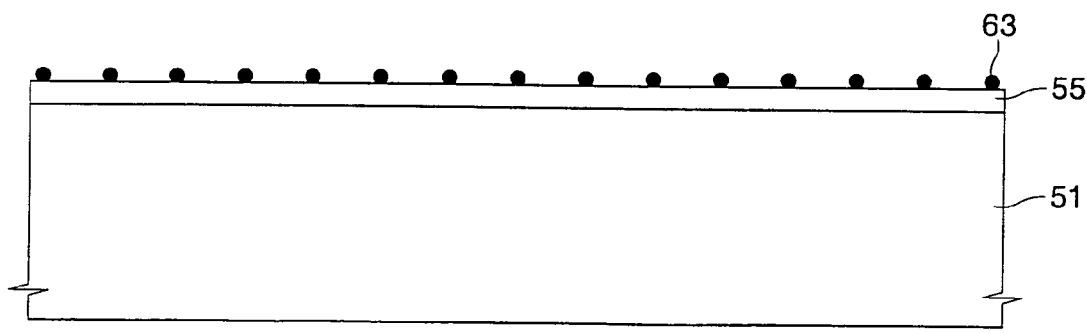
FIG. 4 presents a cross-sectional view illustrating methods of fabricating a non-volatile memory device according to embodiments of the present invention wherein a first reactant is injected into the ALD equipment to form first chemical adsorption points on the tunnel dielectric layer.

Referring to FIGS. 1 and 4, a first reactant is injected into the atomic layer deposition equipment (Step 21 of FIG. 1). The first reactant may be a halogen compound such as $WF_6$, $TiCl_4$, $TiI_4$, $Ti(OEt)_4$, $TaCl_5$, $CuCl$ and/or $MoCl_5$. The first reactant may be an organic compound such as bis(acetylacetonato)nickel(II) ($Ni(acac)_2$). Alternatively, the first reactant may be a compound comprising zirconium (Zr), hafnium (Hf), yttrium (Y) and/or aluminum (Al). In an embodiment of the present invention, the first reactant is $WF_6$. In addition, the first reactant may be a nonmetal material such as $SiCl_4$ or $BCl_3$.

The first reactant forms first reactant chemical adsorption points 63 on the tunnel dielectric layer 55. When the first reactant chemical adsorption points 63 are formed on the tunnel dielectric layer 55, the first excess reactant no longer reacts through a self-limiting reaction process.

When the reduction gas chemical adsorption points 61 are formed on the tunnel dielectric layer 55, the first reactant is transposed with the reduction gas chemical adsorption points 61 to form the first reactant chemical adsorption points 63.

Subsequently, a reaction residue in the atomic layer deposition equipment is removed (Step 22 of FIG. 1). The removal of the reaction residue may be performed by a method such as exhausting the atomic layer deposition equipment, a method of injecting an inert gas into the atomic layer deposition equipment, a method of carrying out both the exhaustion and the injection, and/or a method of sequentially carrying out the exhaustion and the injection at least one time. The inert gas may be argon (Ar) or nitrogen ($N_2$).

Figure 5:
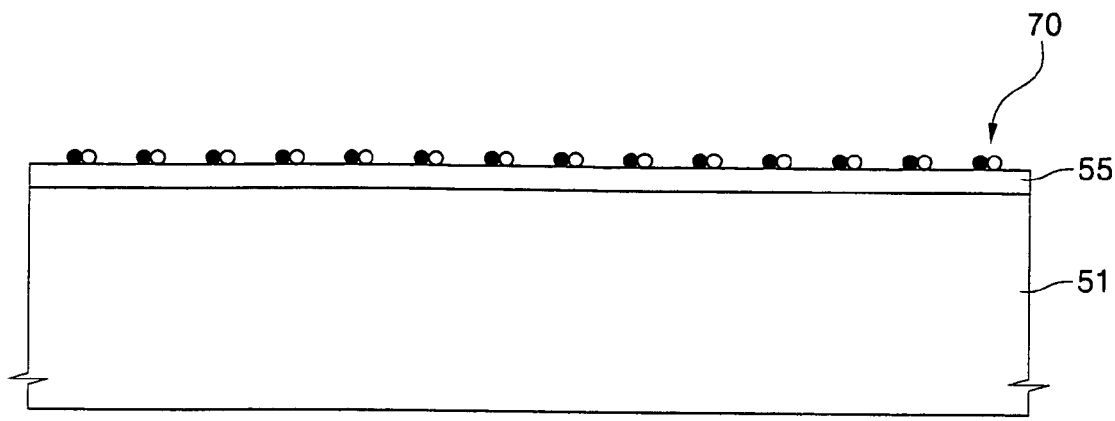
FIG. 5 presents a cross-sectional view illustrating methods of fabricating a non-volatile memory device according to embodiments of the present invention wherein a second reactant is injected into the ALD equipment to react with the first reactant chemical adsorption points shown in FIG. 4.

Referring to FIGS. 1 and 5, a second reactant may be injected into the atomic layer deposition equipment after the reaction residue is removed (Step 23 of FIG. 1). The second reactant may be an ammonia gas such as $NH_3$. Alternatively, $H_2O$, $H_2O_2$, $O_2$ and/or $O_3$ may be used as the second reactant. In particular embodiments of the present invention, the second reactant is an ammonia gas. The second reactant can form nanocrystals 70 by reacting with the first reactant chemical adsorption points 63. In this instance, the injection of the second reactant may be omitted. For example, when $B_2H_6$ is used as the reduction gas, $WF_6$ is used as the first reactant, and the second reactant injection is omitted, tungsten (W) nanocrystals may be formed on the tunnel dielectric layer 55. Further, when $B_2H_6$ is used as the reduction gas, $WF_6$ is used as the first reactant, and ammonia gas is used as the second reactant, tungsten nitride (WN) nanocrystals may be formed on the tunnel dielectric layer 55.

When the second reactant reaches a saturation state by reacting with the first reactant chemical adsorption points 63, the second excess reactant no longer reacts due to a self-limiting reaction process.

Thereafter, a reaction residue in the atomic layer deposition equipment can be removed (Step 24 of FIG. 1). The removal of the reaction residue may be performed in a method such as exhausting the atomic layer deposition equipment, a method of injecting an inert gas into the atomic layer deposition equipment, a method of carrying out both the exhaustion and the injection, and/or a method of sequentially carrying out the exhaustion and the injection at least one time. The inert gas may be argon (Ar) or nitrogen ($N_2$).

Figure 6:
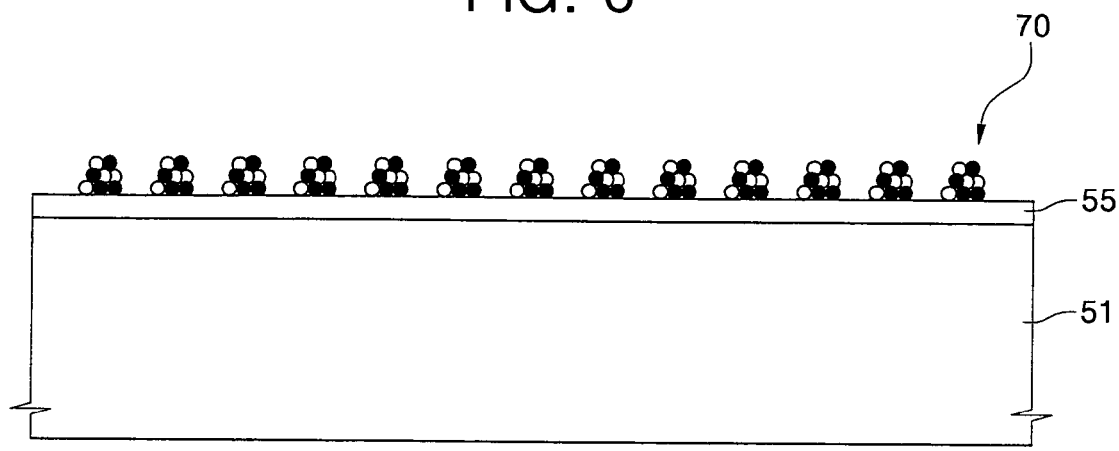
FIG. 6 presents a cross-sectional view illustrating methods of fabricating a non-volatile memory device according to embodiments of the present invention wherein the ALD process described above can be repeated a plurality of times until the nanocrystals having a desired size are formed on the tunnel dielectric layer.

Referring to FIGS. 1 and 6, the size of the nanocrystals 70 can be confirmed (Step 25 of FIG. 1). The atomic layer deposition process cycle 30 can be repeated a plurality of times until the nanocrystals 70 having a desired size are formed on the tunnel dielectric layer 55. Generally, the atomic layer deposition (ALD) method may accurately control the size of the nanocrystals 70 by adjusting the iteration number of the atomic layer deposition process cycle 30.

The nanocrystals 70 can be tungsten (W), titanium (Ti), tantalum (Ta), copper (Cu), molybdenum (Mo) nickel (Ni) and/or a nitride thereof. Alternatively, the nanocrystals 70 may be oxide nanocrystals such as zirconium (Zr), hafnium (Hf), yttrium (Y) and/or aluminum (Al). In addition, the nanocrystals 70 may be silicon nanocrystals, silicon nitride nanocrystals, boron nanocrystals and/or boron nitride nanocrystals.

EXPERIMENTAL EXAMPLE 1

Results of methods of forming tungsten nitride (WN) nanocrystals according to an exemplary embodiment of the present invention are shown in Table 1.

Referring to Table 1, for Experiment 1, when the tunnel dielectric layer 55 was formed of a silicon oxide layer having a thickness of at least about 25 Å on the semiconductor substrate 51, the preheating temperature was about 300° C., $B_2H_6$ 30 sccm was used as the reduction gas, $WF_6$ 120 sccm was used as the first reactant, the ammonia gas was used as the second reactant, and the atomic layer deposition process cycle 30 was performed 30 cycle, tungsten nitride (WN) nanocrystals having a size of about 4 nm to about 5 nm were formed at a density of about $0.9 \times 10^{12}/cm^2$ on the tunnel dielectric layer 55.

For Experiment 2, when the preheating temperature was about 300° C., the $B_2H_6$ 50 sccm was used as the reduction gas, the $WF_6$ 100 sccm was used as the first reactant, and the atomic layer deposition process cycle 30 was performed 10 cycle, tungsten nitride (WN) nanocrystals having a size of about 3.5 nm to about 4.5 nm were formed at a density of aboutn $1.3 \times 10^{12}/cm^2$ on the tunnel dielectric layer 55.

For Experiment 3, when the preheating temperature was about 300° C., the $B_2H_6$ 40 sccm was used as the reduction gas, the $WF_6$ 100 sccm was used as the first reactant, and the atomic layer deposition process cycle 30 was performed 15 cycle, tungsten nitride (WN) nanocrystals having a size of about 3 nm to about 4 nm were formed at a density of about $1.3 \times 10^{12}/cm^2$ on the tunnel dielectric layer 55.

For Experiment 4, when the preheating temperature was about 280° C., the $B_2H_6$ 50 sccm was used as the reduction gas, the $WF_6$ 100 sccm was used as the first reactant, and the atomic layer deposition process cycle 30 was performed fifteen cycle, tungsten nitride (WN) nanocrystals having a size of about 4.5 nm to about 5 nm were formed at a density of about $1.5 \times 10^{12}/cm^2$ on the tunnel dielectric layer 55.

As shown in the results of Experiments 1 to 4, it is possible to form tungsten nitride (WN) nanocrystals having a desired size and density on the tunnel dielectric layer 55 by adjusting the number of cycles of the atomic layer deposition process cycle 30 and process conditions thereof.

Figure 7:
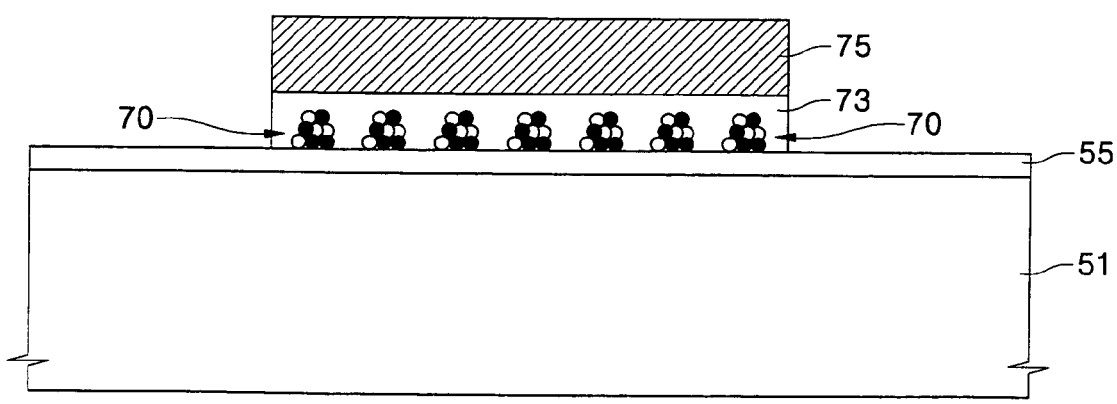
FIG. 7 presents a cross-sectional view illustrating methods of fabricating a non-volatile memory device according to embodiments of the present invention, wherein a control gate dielectric layer is formed on the semiconductor substrate having nanocrystals of a desired size and a control gate electrode is also formed.

Referring to FIGS. 1 and 7, when nanocrystals 70 having a desired size are formed on the tunnel dielectric layer 55, the semiconductor substrate 51 can be removed from the atomic layer deposition equipment (Step 32 of FIG. 1).

A control gate dielectric layer 73 can be formed on the semiconductor substrate 51 having the nanocrystals 70 of a desired size (Step 35 of FIG. 1), and a control gate electrode 75 can be formed (Step 37 of FIG. 1).

TABLE 1

| | Classification | Experiment 1 | Experiment 2 | Experiment 3 | Experiment 4 |
|---|---|---|---|---|---|
| Experiment Condition | Tunnel dielectric layer | $SiO_2$ 25 Å | $SiO_2$ 25 Å | $SiO_2$ 25 Å | $SiO_2$ 25 Å |
| | Preheating temperature | 300° C. | 300° C. | 300° C. | 280° C. |
| | Reduction Gas | $B_2H_6$ 30 sccm | $B_2H_6$ 50 sccm | $B_2H_6$ 40 sccm | $B_2H_6$ 50 sccm |
| | First reactant | $WF_6$ 120 sccm | $WF_6$ 100 sccm | $WF_6$ 100 sccm | $WF_6$ 100 sccm |
| | Second reactant | $NH_3$ | $NH_3$ | $NH_3$ | $NH_3$ |
| | Atomic layer deposition process cycle | 30 cycle | 10 cycle | 15 cycle | 15 cycle |
| Experiment Result | Type of nanocrystals | Tungsten nitride (WN) | Tungsten nitride (WN) | Tungsten nitride (WN) | Tungsten nitride (WN) |
| | Size of nanocrystals | 4 nm~5 nm | 3.5 nm~4.5 nm | 3 nm~4 nm | 4 nm~5 nm |
| | Density of nanocrystals | $0.9 \times 10^{12}/cm^2$ | $1.3 \times 10^{12}/cm^2$ | $1.3 \times 10^{12}/cm^2$ | $1.5 \times 10^{12}/cm^2$ |

Specifically, a dielectric layer, such as a silicon oxide layer, can be formed on the entire surface of the semiconductor substrate 51 having the nanocrystals 70 of a desired size. A conductive layer, such as a polysilicon layer, can be formed on the entire surface of the semiconductor substrate 51 having the dielectric layer. The control gate electrode 75 and the control gate dielectric layer 73 can be formed by successively patterning the conductive layer and the dielectric layer. A process for patterning the conductive layer and the dielectric layer includes forming a photoresist pattern that covers the conductive layer, etching the conductive layer and the dielectric layer using the photoresist pattern as an etch mask, and removing the photoresist pattern.

Typical patterning and source/drain formation processes can then be performed to fabricate a non-volatile memory device.

As described above, according to some embodiments of the present invention, a tunnel dielectric layer can be formed on a semiconductor substrate and nanocrystals can be formed on the tunnel dielectric layer using an atomic layer deposition method. The nanocrystals may be metal nanocrystals such as tungsten (W), or may be metal nitride nanocrystals such as tungsten nitride (WN). Alternatively, the nanocrystals may be metal oxide nanocrystals such as zirconium (Zr) oxide. In addition, the nanocrystals may be silicon nanocrystals, silicon nitride nanocrystals, boron nanocrystals and/or boron nitride nanocrystals. The atomic layer deposition method may accurately control the size of the nanocrystals by adjusting the iteration number of an atomic layer deposition process cycle. Thus, it is possible to manufacture a high-performance non-volatile memory device that uses the nanocrystals as a storage layer.

While the present invention is described in detail herein and further described with reference to the exemplary embodiments, it will be understood by those of ordinary skill in the art that various modifications, alternate constructions and equivalents may be employed without departing from the true spirit and scope of the present invention as defined by the following claims.

What is claimed is:

1. A method of manufacturing a non-volatile memory device, comprising:
    forming a tunnel dielectric layer on a semiconductor substrate;
    subjecting the semiconductor substrate having the tunnel dielectric layer to an atomic layer deposition (ALD) process to form nanocrystals on the tunnel dielectric layer;
    forming a control gate dielectric layer on the semiconductor substrate having the nanocrystals; and
    forming a control gate electrode on the semiconductor substrate having the control gate dielectric layer,
    wherein the atomic layer deposition process comprises:
    injecting a first reactant into the atomic layer deposition chamber to form first reactant chemical adsorption points on the tunnel dielectric layer; and
    removing a reaction residue in an atomic layer deposition chamber using a method selected from the group consisting of a method of exhausting the atomic layer deposition chamber, a method of injecting an inert gas into the atomic layer deposition chamber, a method of carrying out both the exhaustion and the injection, a method of sequentially carrying out the exhaustion and the injection at least one time, or a combination thereof.

2. The method according to claim 1, wherein the first reactant is $WF_6$, $TiCl_4$, $TiI_4$, $Ti(OEt)_4$, $TaCl_5$, $CuCl$, $MoCl_5$, $Ni(acac)_2$ or a combination thereof.

3. The method according to claim 1, wherein the first reactant is a compound comprising zirconium (Zr), hafnium (Hf), yttrium (Y), aluminum (Al) or a combination thereof.

4. The method according to claim 1, wherein the first reactant is $SiCl_4$, $BCl_3$ or a combination thereof.

5. The method according to claim 1, further comprising forming reduction gas chemical adsorption points on the tunnel dielectric layer by injecting a reduction gas into the atomic layer deposition chamber before injecting the first reactant.

6. The method according to claim 5, wherein the reduction gas comprises $B_2H_6$, $SiH_4$, $Si_2H_6$, $SiH_2Cl_6$ or a combination thereof.

7. The method according to claim 5, wherein the reduction gas comprises at least two gases selected from the group consisting of $B_2H_6$, $SiH_4$, $Si_2H_6$ and $SiH_2Cl_6$, wherein the gases are sequentially supplied.

8. The method according to claim 1, further comprising injecting a second reactant into the atomic layer deposition chamber after removing the reaction residue to react the second reactant with the first reactant chemical adsorption points.

9. The method according to claim 8, wherein the second reactant comprises an ammonia gas.

10. The method according to claim 8, wherein the second reactant comprises $H_2O$, $H_2O_2$, $O_2$ or $O_3$.

11. A method of manufacturing a non-volatile memory device, comprising:
    forming a tunnel dielectric layer on a semiconductor substrate;
    subjecting the semiconductor substrate having the tunnel dielectric layer to an atomic layer deposition (ALD) process to form nanocrystals on the tunnel dielectric layer, wherein the nanocrystals are selected from the group consisting of tungsten (W), titanium (Ti), tantalum (Ta), copper (Cu), molybdenum (Mo), nickel (Ni), a nitride thereof or combinations thereof;
    forming a control gate dielectric layer on the semiconductor substrate having the nanocrystals; and
    forming a control gate electrode on the semiconductor substrate having the control gate dielectric layer, wherein the tunnel dielectric layer comprises a silicon oxide layer having a thickness of about 25 Å.

12. The method according to claim 11, wherein the ALD process is performed a plurality of times.

13. The method according to claim 11, wherein the tunnel dielectric layer is formed of at least one layer comprising a silicon oxide layer, a silicon nitride layer, a silicon oxynitride layer, a hafnium oxide layer (HfO), a hafnium silicon oxide layer (HfSiO), a zirconium oxide layer (ZrO), a zirconium silicon oxide layer (ZrSiO), or a gadolinium oxide layer (GdO).

14. The method according to claim 11, wherein the tunnel dielectric layer is formed of a stacked layer or a mixed material layer of at least two layers selected from the group consisting of a silicon oxide layer, a silicon nitride layer, a silicon oxynitride layer, a hafnium oxide layer (HfO), a hafnium silicon oxide layer (HfSiO), a zirconium oxide layer (ZrO), a zirconium silicon oxide layer (ZrSiO), and a gadolinium oxide layer (GdO).

15. A method of manufacturing a non-volatile memory device, comprising:
    forming a tunnel dielectric layer on a semiconductor substrate;
    subjecting the semiconductor substrate having the tunnel dielectric layer to an atomic layer deposition (ALD) process to form nanocrystals on the tunnel dielectric layer, wherein the nanocrystals are oxide nanocrystals comprising zirconium (Zr), hafnium (Hf), yttrium (Y), aluminum (Al) or a combination thereof;

forming a control gate dielectric layer on the semiconductor substrate having the nanocrystals; and forming a control gate electrode on the semiconductor substrate having the control gate dielectric layer, wherein the tunnel dielectric layer comprises a silicon oxide layer having a thickness of about 25 Å.

16. The method according to claim 15, wherein the ALD process is performed a plurality of times.

17. The method according to claim 15, wherein the tunnel dielectric layer is formed of at least one layer comprising a silicon oxide layer, a silicon nitride layer, a silicon oxynitride layer, a hafnium oxide layer (HfO), a hafnium silicon oxide layer (HfSiO), a zirconium oxide layer (ZrO), a zirconium silicon oxide layer (ZrSiO), or a gadolinium oxide layer (GdO).

18. The method according to claim 15, wherein the tunnel dielectric layer is formed of a stacked layer or a mixed material layer of at least two layers selected from the group consisting of a silicon oxide layer, a silicon nitride layer, a silicon oxynitride layer, a hafnium oxide layer (HfO), a hafnium silicon oxide layer (HfSiO), a zirconium oxide layer (ZrO), a zirconium silicon oxide layer (ZrSiO), and a gadolinium oxide layer (GdO).

19. A method of manufacturing a non-volatile memory device, comprising:

forming a tunnel dielectric layer on a semiconductor substrate;

subjecting the semiconductor substrate having the tunnel dielectric layer to an atomic layer deposition (ALD) process to form nanocrystals on the tunnel dielectric layer, wherein the nanocrystals are silicon nanocrystals, silicon nitride nanocrystals, boron nanocrystals, boron nitride nanocrystals or combinations thereof;

forming a control gate dielectric layer on the semiconductor substrate having the nanocrystals; and forming a control gate electrode on the semiconductor substrate having the control gate dielectric layer, wherein the tunnel dielectric layer comprises a silicon oxide layer having a thickness of about 25 Å.

20. The method according to claim 19, wherein the ALD process is performed a plurality of times.

21. The method according to claim 19, wherein the tunnel dielectric layer is formed of at least one layer comprising a silicon oxide layer, a silicon nitride layer, a silicon oxynitride layer, a hafnium oxide layer (HfO), a hafnium silicon oxide layer (HfSiO), a zirconium oxide layer (ZrO), a zirconium silicon oxide layer (ZrSiO), or a gadolinium oxide layer (GdO).

22. The method according to claim 19, wherein the tunnel dielectric layer is formed of a stacked layer or a mixed material layer of at least two layers selected from the group consisting of a silicon oxide layer, a silicon nitride layer, a silicon oxynitride layer, a hafnium oxide layer (HfO), a hafnium silicon oxide layer (HfSiO), a zirconium oxide layer (ZrO), a zirconium silicon oxide layer (ZrSiO), and a gadolinium oxide layer (GdO).

23. A method of manufacturing a non-volatile memory device, comprising:

forming a tunnel dielectric layer on a semiconductor substrate;

injecting a reduction gas into an atomic layer deposition chamber to form reduction gas chemical adsorption points on the tunnel dielectric layer;

injecting a first reactant into an atomic layer deposition chamber to form first reactant chemical adsorption points on the tunnel dielectric layer thereby forming nanocrystals on the semiconductor substrate;

forming a control gate dielectric layer on the semiconductor substrate having the nanocrystals; and forming a control gate electrode on the semiconductor substrate having the control gate dielectric layer.

24. The method according to claim 23, wherein forming the reduction gas chemical adsorption points and forming the first reactant chemical adsorption points are repeated a plurality of times to form a desired size of nanocrystals.

25. The method according to claim 23, wherein the reduction gas comprises $B_2H_6$, $SiH_4$, $Si_2H_6$, $SiH_2Cl_6$ or a combination thereof.

26. The method according to claim 23, wherein the first reactant is $WF_6$, $TiCl_4$, $TiI_4$, $Ti(OEt)_4$, $TaCl_5$, CuCl, $MoCl_5$, $Ni(acac)_2$ or a combination thereof.

27. The method according to claim 23, wherein the nanocrystals comprise tungsten (W), titanium (Ti), tantalum (Ta), copper (Cu), molybdenum (Mo) nickel (Ni) or a combination thereof.

28. The method according to claim 23, further comprising injecting a second reactant into the atomic layer deposition chamber after forming the first reactant chemical adsorption points to react with the first reactant chemical adsorption points.

29. The method according to claim 23, wherein the second reactant comprises an ammonia gas.

30. The method according to claim 23, wherein the nanocrystals are a nitride comprising tungsten (W), titanium (Ti), tantalum (Ta), copper (Cu), molybdenum (Mo), nickel (Ni) or a combination thereof.

31. A method of manufacturing a non-volatile memory device, comprising:

forming a tunnel dielectric layer on a semiconductor substrate;

injecting $B_2H_6$ into a atomic layer deposition chamber to form $B_2H_6$ chemical adsorption points on the tunnel dielectric layer;

injecting $WF_6$ into the atomic layer deposition chamber to react $WF_6$ with the $B_2H_6$ chemical adsorption points to provide tungsten (W) chemical adsorption points on the tunnel dielectric layer;

injecting an ammonia gas into the atomic layer deposition chamber so that the ammonia gas reacts with the tungsten (W) chemical adsorption points to provide tungsten nitride (WN) nanocrystals;

forming a control gate dielectric layer on the semiconductor substrate having the tungsten nitride (WN) nanocrystals; and forming a control gate electrode on the semiconductor substrate having the control gate dielectric layer.

32. The method according to claim 31, wherein reacting $WF_6$ with the $B_2H_6$ chemical adsorption points to provide tungsten (W) chemical adsorption points on the tunnel dielectric layer and injecting an ammonia gas into the atomic layer deposition chamber so that the ammonia gas reacts with the tungsten (W) chemical adsorption points to provide tungsten nitride (WN) nanocrystals are repeated a plurality of times to form a desired size of tungsten nitride (WN) nanocrystals.

* * * * *

UNITED STATES PATENT AND TRADEMARK OFFICE
CERTIFICATE OF CORRECTION

PATENT NO.         : 7,148,106 B2                                           Page 1 of 1
APPLICATION NO.    : 11/023993
DATED              : December 12, 2006
INVENTOR(S)        : Joo et al.

It is certified that error appears in the above-identified patent and that said Letters Patent is hereby corrected as shown below:

On Title Page
Item 56
Please add the following to the list of References Cited:

| | | | |
|---|---|---|---|
| 6,400,610 B1   | 06/04/2002 | Sadd        | 365/185.29 |
| 6,090,666      | 07/18/2000 | Ueda et al. | 438/257    |
| 2002/0098653 A1| 07/25/2002 | Flagan et al.| 438/260   |

Signed and Sealed this

Eighteenth Day of September, 2007

JON W. DUDAS
*Director of the United States Patent and Trademark Office*